United States Patent
Fang et al.

(10) Patent No.: US 9,739,808 B2
(45) Date of Patent: Aug. 22, 2017

(54) DEVICES, METHODS, AND SYSTEMS FOR SENSING CURRENT

(75) Inventors: Huabin Fang, Shanghai (CN); Xinhui Mao, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 111 days.

(21) Appl. No.: 14/358,374

(22) PCT Filed: Nov. 29, 2011

(86) PCT No.: PCT/CN2011/083145
§ 371 (c)(1),
(2), (4) Date: May 15, 2014

(87) PCT Pub. No.: WO2013/078615
PCT Pub. Date: Jun. 6, 2013

(65) Prior Publication Data
US 2014/0292319 A1    Oct. 2, 2014

(51) Int. Cl.
*G01R 33/09* (2006.01)
*G01R 19/00* (2006.01)
*G01R 33/02* (2006.01)
*G01R 15/20* (2006.01)

(52) U.S. Cl.
CPC .......... *G01R 19/00* (2013.01); *G01R 15/205* (2013.01); *G01R 33/02* (2013.01); *G01R 33/098* (2013.01); *G01R 33/093* (2013.01)

(58) Field of Classification Search
CPC ........ G01R 33/098; G01R 7/30; G01R 33/02; G01R 33/093
USPC .................................................. 324/249, 252
See application file for complete search history.

(56) References Cited

U.S. PATENT DOCUMENTS

| | | | |
|---|---|---|---|
| 7,220,602 B2 * | 5/2007 | Chung et al. ................ | 438/3 |
| 8,629,519 B2 * | 1/2014 | Lee et al. .................... | 257/421 |
| 8,816,683 B2 * | 8/2014 | Wang et al. ................. | 324/252 |
| 8,952,686 B2 * | 2/2015 | Holman, Jr. ......... | G01R 15/205 324/207.11 |
| 9,041,388 B2 * | 5/2015 | Ogimoto ..................... | 324/244 |

* cited by examiner

*Primary Examiner* — Reena Aurora
(74) *Attorney, Agent, or Firm* — Brooks, Cameron & Huebsch, PLLC

(57) ABSTRACT

Devices, methods, and systems for sensing current are described herein. One device includes a first electrode, a second electrode, and a tunneling magnetoresistance material between the first and second electrodes.

16 Claims, 5 Drawing Sheets

DEVICES, METHODS, AND SYSTEMS FOR SENSING CURRENT

TECHNICAL FIELD

The present disclosure relates to devices, methods, and systems for sensing current.

BACKGROUND

A current through a circuit conductor (e.g., a wire) may be determined (e.g., sensed, acquired, and/or measured) based on, for example, a magnetic field generated by the circuit conductor as the current passes through the circuit conductor. Determining current based on a magnetic field may allow the current to be measured without physically contacting the circuit conductor, for example.

Some previous approaches for determining current based on a magnetic field may use a number of Hall sensors placed in a gap of a magnetic core to concentrate the magnetic flux produced by the current. Hall sensors can be single chip sensors which may be relatively inexpensive, but may lack sensitivity and/or accuracy in operation.

Other previous approaches for determining current based on a magnetic field may use a number of anisotropic magnetoresistance (AMR) sensors placed in a gap of a magnetic core to concentrate the magnetic flux produced by the current. AMR sensors may be accurate, but may have a low magnetoresistance ratio and/or a narrow monotone linear sensing range. Such shortcomings may limit the sensitivity and/or sensing range of current sensors. Additionally, current sensors using AMR may have complicated structures and/or multiple components. As a result, current sensors using AMR may use a large amount of space (e.g., volume), a large amount of power, and/or may be costly to operate.

DETAILED DESCRIPTION

Figure 1A:
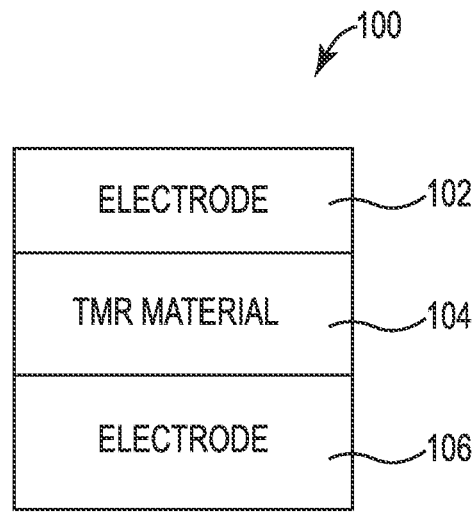
FIG. 1A illustrates a tunneling magnetoresistance resistor in accordance with one or more embodiments of the present disclosure.

Devices, methods, and systems for sensing current are described herein. For example, one or more embodiments include a first electrode, a second electrode, and a tunneling magnetoresistance material between the first and second electrodes.

One or more embodiments of the present disclosure can sense a current associated with (e.g., through) a circuit conductor based on a magnetic field generated by the circuit conductor as the circuit conductor conducts the current. For example, one or more embodiments of the present disclosure can sense a current without the use of a magnetic core.

Embodiments of the present disclosure can sense current with a greater sensitivity, accuracy, and/or sensing range than previous approaches (e.g., approaches using Hall and/or AMR sensors). Additionally, embodiments of the present disclosure can sense current using less power, space, and/or cost than previous approaches.

In the following detailed description, reference is made to the accompanying drawings that form a part hereof. The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 222 may reference element "22" in FIG. 2, and a similar element may be referenced as 322 in FIG. 3.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of TMR resistors" can refer to one or more TMR resistors.

FIG. 1A illustrates a tunneling magnetoresistance (TMR) resistor 100 in accordance with one or more embodiments of the present disclosure. As shown in FIG. 1 A, resistor 100 can include a first electrode 102 and a second electrode 106. Electrodes 102 and/or 106 can be a number of various conductive materials (e.g., tantalum). Additionally and/or alternatively, electrodes 102 and/or 106 can be ferromagnetic electrodes.

As shown in FIG. 1, resistor 100 can include a TMR material 104 between the first electrode 102 and the second electrode 106. TMR material 104 can include a number of ferromagnetic materials separated by an insulator (e.g., tunneling barrier) material.

Ferromagnetic materials associated with TMR material 104 can include a number of materials, such as Nickel (Ni), Iron (Fe), Cobalt (Co), Ruthenium (Ru), Platinum (Pt), Manganese (Mn), and/or alloys or combinations of a number of these materials and/or other materials, for example. In an example, TMR material 104 can include a number of materials (e.g., adjacent layers in a material stack) including, for example, NiFe (e.g., adjacent to electrode 102), CoFe, Barrier material, CoFe, Ru, CoFe, and PtMn (e.g., adjacent to a seed layer and/or electrode 106).

Barrier materials associated with TMR material 104 can include Aluminum Oxide (e.g., amorphous Aluminum Oxide) and/or Magnesium Oxide, for example. A tunneling resistance (e.g., resistance of electrons tunneling) through TMR material 104 can vary according to a magnitude of an external magnetic field applied to TMR material 104.

The thickness and/or amount of TMR material 104 in TMR resistor 100 can be based on a desired resistance, for instance. For example, the thickness of the barrier material associated with TMR material 104 can be on the order of a tenth of a nanometer, and can be uniform or non-uniform. The thickness of TMR material 104 can be controlled during manufacture. For example, TMR material 104 can be deposited by magnetron sputter deposition, molecular beam epitaxy, pulsed laser deposition and/or electron beam physical vapor deposition, among other methods.

Figure 1B:
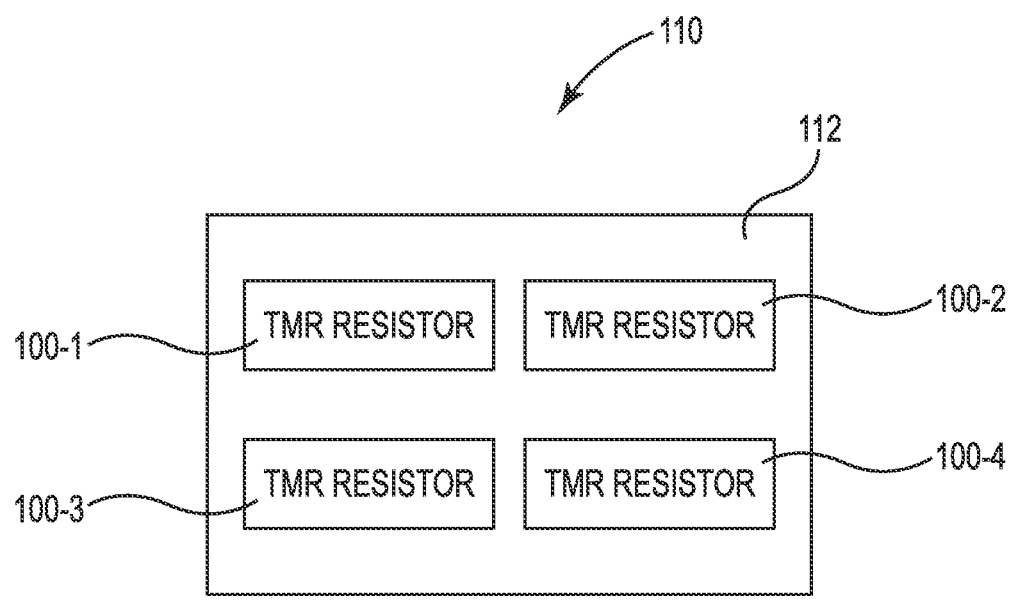
FIG. 1B illustrates a current sensor in accordance with one or more embodiments of the present disclosure.

FIG. 1B illustrates a current sensor (e.g., TMR current sensor) 110 in accordance with one or more embodiments of the present disclosure. As shown in FIG. 1B, current sensor 110 can include a number of TMR resistors 100-1, 100-2, 100-3, and 100-4 on a substrate (e.g., wafer) 112. Substrate 112 can include various materials such as, for example, silicon, silicon dioxide, aluminum oxide, sapphire, germanium, gallium arsenide, and/or indium phosphide, and/or combinations of these and/or other materials.

TMR resistors 100-1 to 100-4 can be analogous to TMR resistor 100 previously discussed in connection with FIG. 1A. Although four TMR resistors are illustrated in FIG. 1, embodiments of the present disclosure are not limited to a particular number of TMR resistors.

TMR resistors 100-1 to 100-4 can be positioned on substrate 112 in a particular arrangement (e.g., pattern). Positioning of TMR resistors 100-1 to 100-4 on substrate 112 in accordance with embodiments of the present disclosure is not limited to a particular arrangement and can include a Wheatstone bridge arrangement, for instance. The positioning of TMR resistors 100-1 to 100-4 can be based on considerations such as the number (e.g., amount) of TMR resistors to be used and/or the size of substrate 112, for example.

Figure 2:
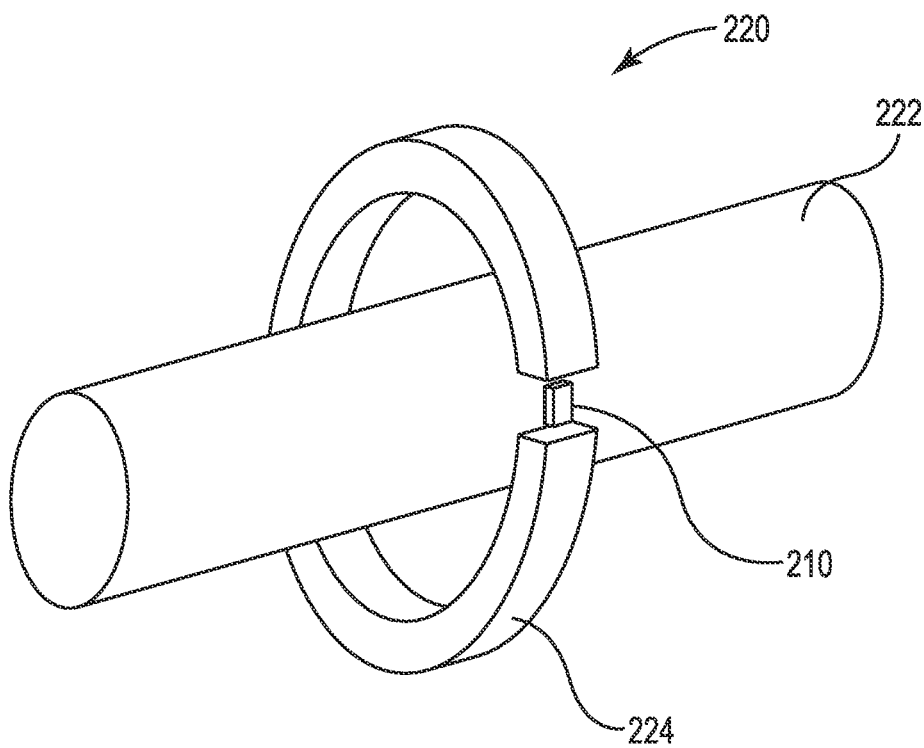
FIG. 2 illustrates a system for sensing a current in accordance with one or more embodiments of the present disclosure.

TMR resistors 100-1 to 100-4 can have a direction of a ferromagnetic layer magnetization associated therewith. For example, TMR resistors 100-1 and 100-4 can have a ferromagnetic layer magnetization in a first direction and TMR resistors 100-2 and 100-3 can have a ferromagnetic layer magnetization in a second (e.g., different) direction. FIG. 2 illustrates a system 220 for sensing a current in accordance with one or more embodiments of the present disclosure. As shown in FIG. 2, a current sensor 210 can be positioned in a gap (e.g., slot) of a magnetic core 224 that surrounds (e.g., encloses and/or encircles) a portion of a circuit conductor (e.g., wire) 222. Current sensor 210 can be analogous to current sensor 110 previously described in connection with FIG. 1B.

Magnetic core 224 can concentrate (e.g., trap) a magnetic field (e.g., magnetic flux) produced by circuit conductor 222 as circuit conductor 222 conducts a current. Additionally, magnetic core 224 can shield current sensor 210 from additional (e.g., external and/or undesired) magnetic fields such as the magnetic field associated with the earth. Magnetic core 224 can include a number of various conductive and/or permeable materials, such as iron, for instance. The magnetic field produced by circuit conductor 222 can cross current sensor 210 at the gap of magnetic core 224.

The gap (e.g., size and/or distance of the gap) of magnetic core 224 can be based on the presence or absence of additional magnetic fields and the degree to which current sensor 210 is to be shielded from such fields. For example, a larger gap can decrease the amount of additional magnetic field in the gap.

Figure 3:
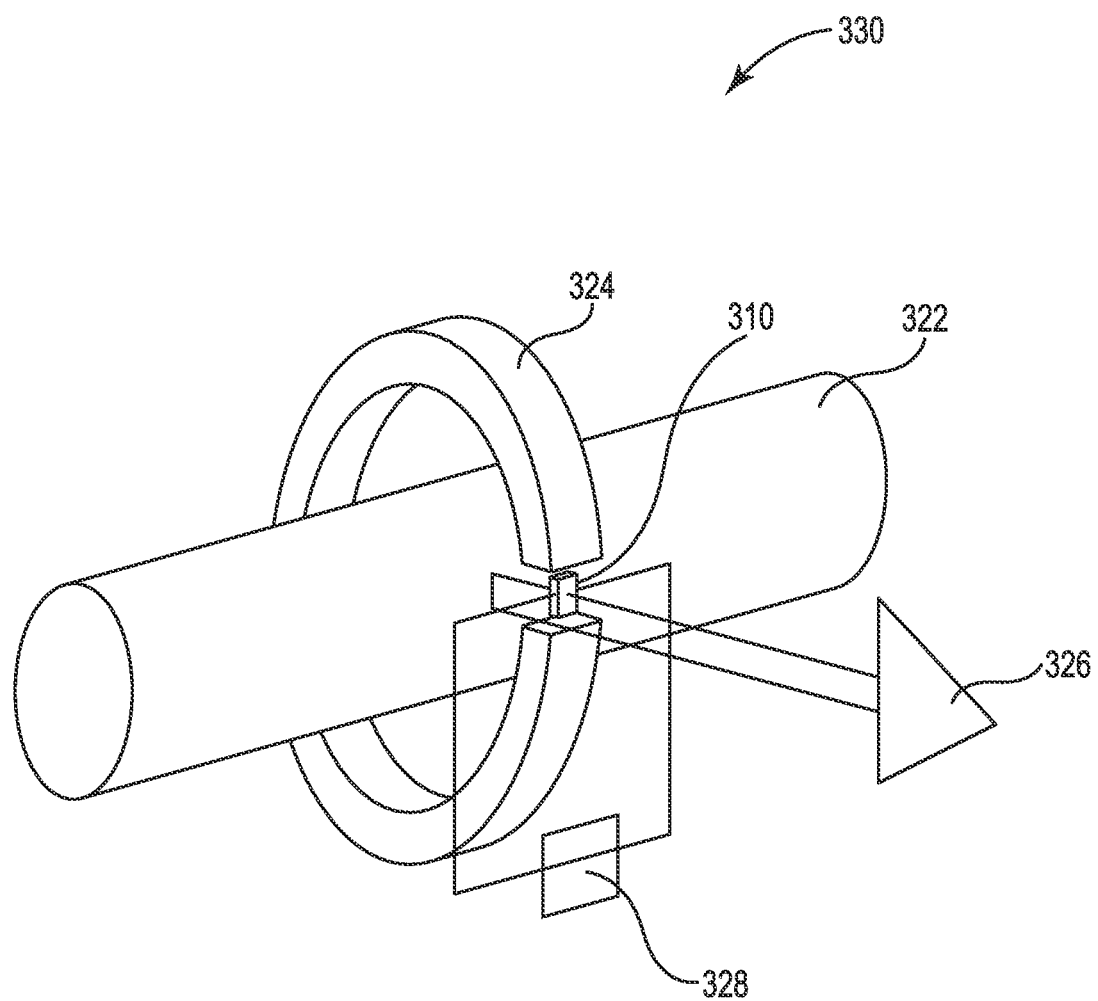
FIG. 3 illustrates an open-loop system for sensing a current in accordance with one or more embodiments of the present disclosure.

FIG. 3 illustrates an open-loop system 330 for sensing a current in accordance with one or more embodiments of the present disclosure. In a manner analogous to system 220, system 330 includes a current sensor 310 in a gap of a magnetic core 324 that surrounds a portion of a circuit conductor 322.

Additionally, as shown in FIG. 3, system 330 includes a current or voltage source 328 which can induce a current (e.g., a control current) to travel through current sensor 310 (e.g., through a number of TMR resistors associated with current sensor 310). As circuit conductor 322 conducts the current (e.g., the primary current) to be sensed, magnetic core 324 can concentrate the magnetic field produced by the primary current.

As the control current passes through current sensor 310, tunneling resistance through a number of TMR resistors associated with current sensor 310 can vary based on an external magnetic field, as previously discussed. Thus, as the magnetic field through magnetic core 324 varies with the primary current through circuit conductor 322, the tunneling resistance through a number of TMR resistors associated with current sensor 310 can vary.

As the tunneling resistance through the number of TMR resistors varies, an induced voltage can be produced and/or measured across the number of TMR resistors. Such a voltage can be amplified by amplifier 326 for more accurate measurement, for example. It is to be appreciated that such an induced voltage can be proportional to the current conducted by circuit conductor 322. Accordingly, the induced voltage can be used to determine the current conducted by circuit conductor 322.

Figure 4:
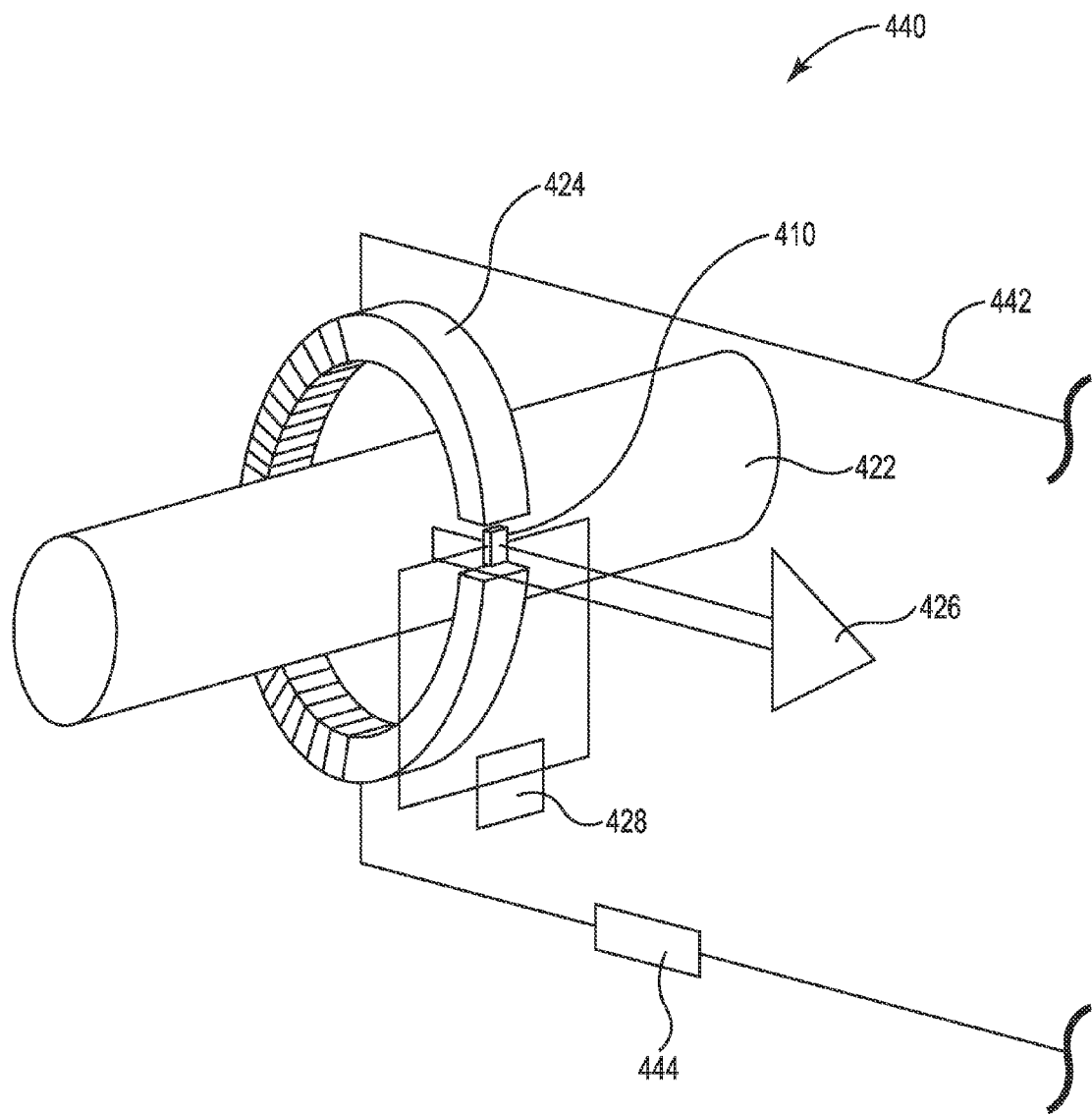
FIG. 4 illustrates a closed-loop system for sensing a current in accordance with one or more embodiments of the present disclosure.

FIG. 4 illustrates a closed-loop system 440 for sensing a current in accordance with one or more embodiments of the present disclosure. In a manner analogous to systems 220 and 330 previously discussed, system 440 includes a current sensor 410 in a gap of a magnetic core 424 that surrounds a portion of a circuit conductor 422.

A closed-loop system, system 440 includes a second circuit conductor (e.g., wire) 442 having a number of coils winding around a portion of magnetic core 424. Circuit conductor 442 can conduct a current through a number of winds around magnetic core 424 and can be connected to a burden (e.g., load) resistor 444. A closed loop system, such as that illustrated in FIG. 4 (e.g., system 440) can measure a greater range of current than, for example, an open loop system (e.g., system 330 previously discussed in connection with FIG. 3).

In a manner analogous to system 330 previously discussed in connection with FIG. 3, system 440 includes a power source 428 which can induce a current to travel through current sensor 410 (e.g., through a number of TMR resistors associated with current sensor 410). Additionally analogous to system 330 previously discussed, system 440 includes an amplifier to amplify the induced voltage associated with current sensor 410.

Circuit conductor 442 can conduct a current around magnetic core 424 such that current sensor 410 is in a compensating field (e.g., the field across the current sensor can be zero). A wind ratio (e.g., number of winds around magnetic core 424) of circuit conductor 442 can be such that the current through circuit conductor 442 is proportional to the field produced by circuit conductor 422 scaled by the winds ratio. Burden resistor 444 can be placed in series with circuit conductor 442 (as shown in FIG. 4) and can, for example, measure a voltage proportional to the current conducted through circuit conductor 422.

Figure 5:
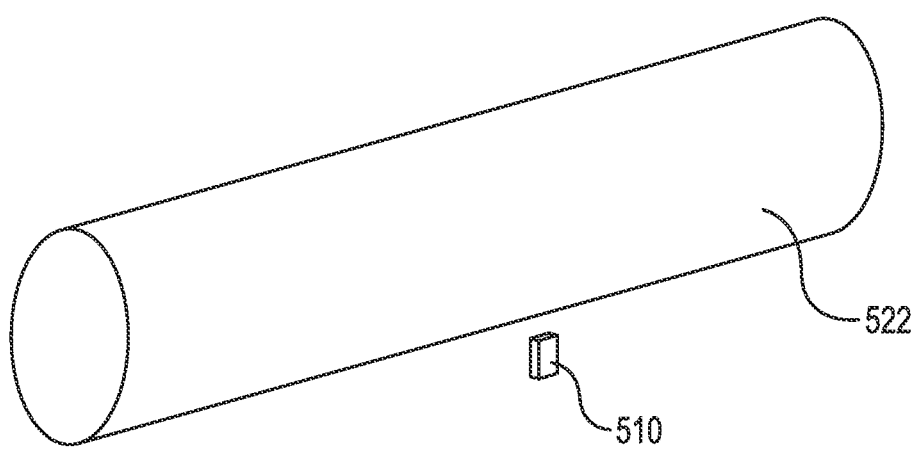
FIG. 5 illustrates a current sensor not having a magnetic core associated therewith in accordance with one or more embodiments of the present disclosure.

FIG. 5 illustrates a current sensor 510 not having a magnetic core associated therewith in accordance with one or more embodiments of the present disclosure. Benefits of not including a magnetic core can include, for example, using a smaller amount of space (e.g., volume) and/or power than approaches using a magnetic core. Additionally, not using a magnetic core can allow current sensor 510 to use a less complicated structure and/or fewer components than approaches using a magnetic core. As shown in FIG. 5, current sensor 510 can be positioned adjacent to a circuit conductor 522. Current sensor 510 and/or circuit conductor 522 can be analogous to a number of sensors and/or circuit conductors previously discussed, though embodiments of the present disclosure are not limited to those specifically discussed herein.

Current sensor 510 can sense a magnetic field produced by circuit conductor 522 as circuit conductor 522 conducts a current. In the embodiment illustrated in FIG. 5, current sensor 510 is not associated with a magnetic core. Though not shown in FIG. 5 to clearly illustrate aspects of various embodiments, current sensor 510 can be attached (e.g., affixed) to a portion of circuit conductor 522. Further, although one current sensor is shown, embodiments of the present disclosure do not limit an amount of current sensors used to measure current associated with circuit conductor 522.

Although not illustrated in FIGS. 1A through 5 for clarity and so as not to obscure embodiments of the present disclosure, current sensors in accordance with one or more embodiments of the present disclosure can include a conductive shield (e.g., soft-magnetic conductive shield) surrounding a portion thereof. Such a shield can be made from various conductive and/or soft magnetic materials and can surround a portion and/or the entirety of a current sensor and/or a circuit conductor. Shielding can prevent external magnetic fields (e.g., fields associated with additional circuit conductors) from affecting magnetic field data acquisition by a number of the various sensors discussed herein.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:
1. A current sensor, comprising:
a first electrode;
a second electrode; and
a tunneling magnetoresistance material between the first and second electrodes, wherein the current sensor is configured to sense a magnetic field associated with a circuit conductor while the circuit conductor is conducting a current, wherein the current sensor is positioned on a substrate having an additional current sensor positioned thereon, and wherein the additional current sensor includes an additional tunneling magnetoresistance material between a third electrode and a fourth electrode.

2. the current sensor of claim 1, wherein the tunneling magnetoresistance material includes a barrier material.

3. the current sensor of claim 2, wherein the barrier material includes magnesium oxide.

4. the current sensor of claim 2, wherein the barrier material includes aluminum oxide.

5. the current sensor of claim 1, wherein the first and second electrodes are ferromagnetic electrodes.

6. The current sensor of claim 1, wherein the current sensor and the additional current sensor are positioned such that a direction of a magnetization of a ferromagnetic layer of the tunneling magnetoresistance material of the current sensor is different than a direction of a magnetization of a ferromagnetic layer of the additional tunneling magnetoresistance material of the additional current sensor.

7. A current sensing system, comprising:
a magnetic core having a gap therein; and
a current sensor in the gap of the magnetic core, wherein the current sensor includes:
a first electrode;
a second electrode; and
a tunneling magnetoresistance material between the first and second electrodes,
wherein the current sensor is configured to sense a magnetic field associated with a circuit conductor while the circuit conductor is conducting a current, wherein the current sensor is positioned on a substrate having an additional current sensor positioned thereon, and wherein the additional current sensor includes an additional tunneling magnetoresistance material between a third electrode and a fourth electrode.

8. The system of claim 7, wherein the magnetic core is configured to surround a portion of a circuit conductor conducting a current.

9. The system of claim 7, wherein the system includes a current source configured to conduct a current through the current sensor.

10. The system of claim 7, wherein the system is an open-loop system having an amplifier configured to amplify an induced voltage associated with the current sensor.

11. The system of claim 10, wherein the system includes a device configured to measure the amplified induced voltage associated with the current sensor.

12. The system of claim 7, wherein the system is a closed-loop system having a burden resistor in series with a circuit conductor that winds around the magnetic core.

13. The system of claim 7, wherein the system does not include an application-specific integrated circuit associated with the sensor.

14. A current sensing system, comprising:
a circuit conductor; and
a current sensor adjacent to the circuit conductor, wherein the current sensor includes:
a first electrode;
a second electrode; and a tunneling magnetoresistance material between the first and second electrodes;

wherein the current sensor is configured to sense a magnetic field associated with a circuit conductor while the circuit conductor is conducting a current, wherein the current sensor is positioned on a substrate having an additional current sensor positioned thereon, wherein the additional current sensor includes an additional tunneling magnetoresistance material between a third electrode and a fourth electrode, and wherein the current sensing system does not include a magnetic core.

15. The system of claim 14, wherein the current sensor is adjacent to the circuit conductor.

16. The system of claim 14, wherein the system includes a soft-magnetic conductive shield surrounding a portion of the current sensor.

* * * * *